AUTOMATIC FREQUENCY CONTROL SYSTEM
Filed March 21, 1946
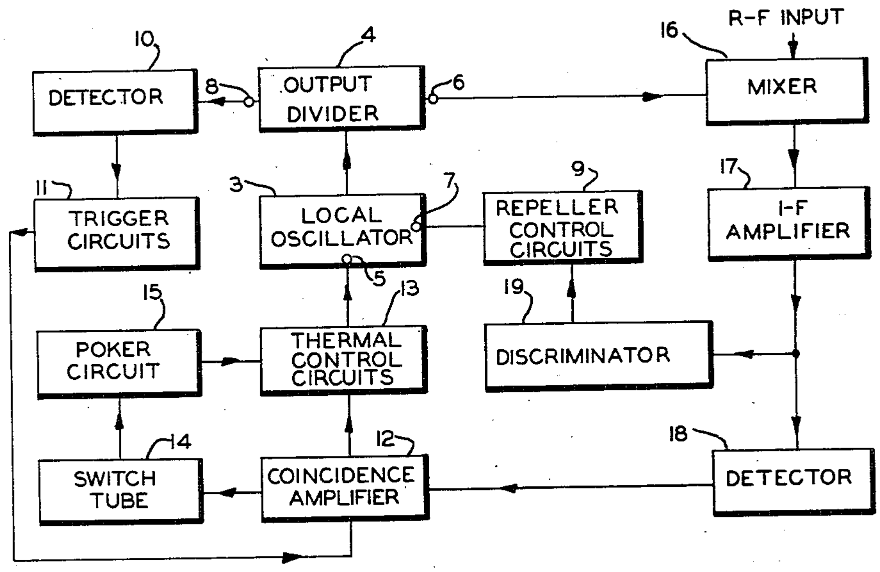
INVENTOR.
GEORGE H. NIBBE
BY M. A. Hayes
ATTORNEY United States Patent Office 2,789,226

Patented Apr. 16, 1957

2,789,226

AUTOMATIC FREQUENCY CONTROL SYSTEM

George H. Nibbe, Chicago, Ill., assignor, by mesne assignments, to the United States of America as represented by the Secretary of the Navy Application March 21, 1946, Serial No. 655,938

13 Claims. (Cl. 250—36)

This invention relates to electrical control systems and more particularly to automatic tuning control systems for oscillators.

Heretofore automatic tuning control systems permitted only a relatively small frequency range of automatic tuning of the oscillator with the attendant difficulty that, as in a radar system, the receiver could not automatically follow appreciable changes of the transmitter frequency.

A general object of the present invention is to overcome the foregoing difficulties.

Another object of the present invention is to provide an automatic tuning control system capable of providing a comparatively wide range of automatic tuning of the oscillator.

A further object is to provide an automatic tuning control system which maximizes the signal output of the oscillator.

A still further object is to provide an automatic tuning control system having rapid response.

These and other objects will be apparent from the following specification when taken with the accompanying drawing, the single figure of which is a block diagram of one form of the invention.

Referring to the drawing an automatic tuning control system is shown for local oscillator 3. The local oscillator tube 3 is that type of tube, such as the Neher tube, which has a mechanical frequency control means or thermal control 5 and an electrical frequency control means or repeller 7. The signal output of oscillator 3 is split by a dividing device or output divider 4 providing outputs at points 6 and 8. The output at 6, along with the R. F. input, is applied to a conventional mixer 16 which provides an I. F. output voltage. I. F. amplifier 17 provides sufficient amplification for this voltage before it is applied to a discriminator 19. Discriminator 19 can be any circuit which produces an output voltage over a certain range which goes in a negative direction as its input frequency deviates in one direction from a predetermined fixed frequency (in this case the intermediate frequency) and which goes in a positive direction as its input frequency deviates in the opposite direction. Suitable electronic circuits or repeller control circuits 9 apply the output voltage of the discriminator 19 to repeller 7 to maintain oscillator 3 at the correct frequency.

The output at 8 of divider 4 is applied to detector 10 which produces an output D. C. voltage proportional to the power output of oscillator 3. The output voltage of detector 10 is applied to trigger circuits 11. These trigger circuits may comprise a two tube electronic circuit having two stable conditions. Trigger circuits 11 assume one stable condition when the input voltage from detector 10 is above a certain critical value and assume the other stable condition when the input voltage is below a certain critical value. An output voltage wave is obtained from the plate circuit of one of its tubes through a differentiating circuit such that a positive trigger is produced each time the power output of oscillator 3 decreases from its maximum. Likewise a negative trigger is produced each time the power output approaches its maximum. These triggers are applied to a coincidence circuit or amplifier 12.

A second detector 18 is energized by a second output of I. F. amplifier 17 and produces an output voltage proportional to the signal output of amplifier 17. Thus detector 18 provides a positive output voltage, which is applied to coincidence amplifier 12, only when local oscillator 3 is near enough to the correct frequency to produce an I. F. signal.

In one embodiment of this invention coincidence amplifier 12 may be a pentode having its control grid and suppressor grid biased below cut off so that both grids require a positive signal to cause conduction. The output of trigger circuits 11 is applied to the suppressor grid and the output of detector 18 is applied to the control grid. A negative trigger output is obtained at the plate whenever the two aforementioned input voltages occur simultaneously. Although a pentode electronic tube has been disclosed it is to be understood that any other coincidence circuit having two inputs may be used. When this invention is used in a radar system the output of detector 18 is primarily a series of pulses in which case the positive trigger from trigger circuits 11 must be of sufficient duration to include at least one such pulse. Since the suppressor grid of coincidence amplifier 12 is below cut off the negative trigger from trigger circuits 11 has no effect on the output.

Thermal control circuits 13 for the mechanical frequency control means may comprise a scale-of-two circuit, which reverses the mechanical or thermal tuning sweep of oscillator 3 each time it is energized by a negative trigger from coincidence amplifier 12. Thus, as long as oscillator 3 is near to its correct frequency as evidenced by a sufficient voltage output from detector 18, thermal control 5 will cause the cavity of oscillator 3 to sweep back and forth about a predetermined frequency, the sweep reversing each time the signal output of oscillator 3 decreases and produces a positive trigger output from trigger circuits 11, thereby providing maximum signal output from oscillator 3.

Should oscillator 3 start or arrive at a frequency such that discriminator 19 and repeller control circuits 9 could not bring it to the correct frequency, a "poker" circuit 15 is provided to cause the thermal tuning to periodically reverse and find the correct frequency. Poker circuit 15 is a very low frequency oscillator having a period comparable to the time necessary for thermal control circuits 13 to tune oscillator 3 through its entire range. When oscillator 3 is near its correct frequency there will be an output from detector 18 and coincidence amplifier 12. The output from coincidence amplifier 12 is used to energize a long time constant detector or switch tube 14 which deenergizes the poker circuit 15 by biasing it beyond cut off. Thus poker 15 is only operative when oscillator 3 is so far off its correct frequency that there is no appreciable I. F. signal output from amplifier 17. If the discriminator 19 is the type which functions correctly only on one side band this invention will not lock on the wrong side band since, by making the band width of I. F. amplifier 17 comparable to the working range of discriminator 19, normal functioning of discriminator 19 will detune local oscillator 3. Thus the I. F. input to detector 18 will be insufficient to produce an output from coincidence amplifier 12 so that switch tube 14 will not deenergize poker 15 which then will act to cause oscillator 3 to seek a frequency such as to operate on the correct side band.

In view of the foregoing description of the automatic tuning control system, it may be seen that the two frequency-control means provided by the specific type of local oscillator tube 3 are used to maintain substantially constant output frequency. The frequency control means as described are a repeller electrode 7 and a thermal tuner 5 and are rapid and slow in action respectively. The slowly acting means are periodically energized, and would if acting singly cause the frequency of the oscillator to sweep back and forth about the desired output frequency. However, such frequency sweep is precluded by the normal operation of the rapidly acting, repeller frequency control system. In operation, the repeller control causes the frequency deviation from the desired frequency to be extremely small, its effect on the frequency of the oscillator being continuously opposite to the effect of the thermal tuner. If the frequency of the R. F. input fluctuates within the frequency control range of the repeller electrode, the repeller control circuit will rapidly act to alter the local oscillator frequency so that the proper I. F. is obtained.

The invention described in the foregoing specification need not be limited to the details shown, which are considered to be illustrative of one form the invention may take.

What is claimed is:

1. In electrical apparatus for a receiver local oscillator having a frequency control electrode and a mechanical frequency control means, an automatic tuning control system comprising, means for dividing the signal output of said oscillator to provide two outputs, a mixer energized by a first output of said dividing means and a radio frequency signal, a discriminator circuit energized by an output of said mixer and providing over a certain range an output voltage proportional to the frequency error of aforesaid oscillator, and means for applying said output voltage of said discriminator to said frequency control electrode to control the frequency of said local oscillator, a detector energized by the second of said outputs of said dividing device, said detector providing an output voltage proportional to the signal output of said oscillator, trigger circuits energized by said output voltage of said detector and providing a positive trigger output each time said signal output of said oscillator decreases from a maximum, a second detector energized by another output of aforesaid mixer and providing an output signal when said oscillator is substantially at its correct frequency, a coincidence circuit energized by said output signal of said second detector and by said positive trigger output of said trigger circuit and providing a trigger output, and control circuits for said mechanical frequency control means energized by said trigger output of said coincidence circuit and causing the mechanical tuning of aforesaid local oscillator to sweep back and forth, whereby the signal output from said oscillator is a maximum.

2. Electrical apparatus as in claim 1 having in addition, a low frequency oscillator circuit operative to trigger periodically said control circuits for said mechanical frequency control means causing said local oscillator to reverse its frequency sweep, and a switch tube connected to an output of said coincidence circuit and deenergizing said low frequency oscillator circuit when said local oscillator is substantially at said correct frequency.

3. In electrical apparatus for an oscillator having a frequency control electrode and mechanical frequency control means responsive to an operating voltage coupled thereto, a source of variable voltage, means for coupling said voltage source to said frequency control electrode to control the frequency of said oscillator, and means responsive to variations in the power output of said oscillator for providing an operating voltage for said mechanical control means tending to maintain a maximum amount of power output from said oscillator.

4. In electrical apparatus for an oscillator having a frequency control electrode and mechanical frequency control means, said mechanical control means itself being adapted to be controlled by a control potential, means for applying a control potential to said frequency control electrode for controlling the frequency of said oscillator, means responsive to variations in the power output of said oscillator for obtaining a second control potential, and means for applying said second control potential to said mechanical frequency control means for tuning said oscillator in a direction to maximize the output thereof.

5. In electrical apparatus, an oscillator including first and second frequency controlling means, said first frequency controlling means being adapted to respond substantially instantaneously in response to a control potential applied thereto, said second frequency control means being adapted to respond to a control potential after a predetermined time interval has elapsed, means for applying a first control potential to said first frequency controlling means, means responsive to variations in the power output of said oscillator for producing a second control potential, means for applying said second control potential to said second frequency controlling means for maintaining the power output of said oscillator at a maximum.

6. In electrical apparatus, an oscillator including a frequency control electrode and mechanical tuning means, said mechanical tuning means being adapted to be controlled by a control potential, means for applying a potential to said frequency control electrode for controlling the frequency of said oscillator, and means responsive to variations in the power output of said oscillator for generating a second control potential and applying said second control potential to said mechanical tuning means for mechanically tuning said oscillator.

7. In electrical apparatus, an oscillator comprising a frequency control electrode, a cavity resonator and mechanical tuning means for tuning said cavity resonator, said mechanical tuning means being adapted to be controlled by a control potential, means for applying a control potential to said frequency control electrode for controlling the frequency of said oscillator, means responsive to variations in the power output of said oscillator for generating a second control potential in accordance with the magnitude of the power output of said oscillator, and means for applying said second control potential to said mechanical tuning means for tuning the cavity resonator of said oscillator to the frequency of oscillation of said oscillator.

8. In electrical apparatus, an oscillator comprising first and second tuning means, said first tuning means controlling the frequency of said oscillator independently of said second tuning means, said second tuning means being adapted to control the power output of said oscillator for any one frequency established by said first tuning means, and means for controlling said second tuning means in accordance with the power output of said oscillator whereby for any frequency of oscillation established by said first tuning means said second tuning means automatically tunes said oscillator for maximum power output at said frequency.

9. In electrical apparatus for an oscillator having a frequency control electrode and a mechanical frequency control means, an automatic tuning control system comprising, means for applying a first control potential to said frequency control electrode for controlling the frequency of said oscillator, a detector energized by the output of said oscillator, said detector providing an output voltage that is a function of the signal output of said oscillator, trigger circuits energized by said output voltage of said detector and providing a positive trigger output each time said signal output of said oscillator decreases from a maximum, and control circuits responsive only to said positive trigger output from said trigger circuits for operating said mechanical frequency control means to cause the mechanical tuning of said oscillator to sweep back and forth about the frequency of oscillation whereby the signal output from said oscillator is a maximum.

10. Apparatus of claim 9 wherein said local oscillator includes a cavity resonator and wherein said mechanical frequency control means is adapted to tune the cavity resonator of said oscillator.

11. In electrical apparatus for a receiver local oscillator having a frequency control electrode and a mechanical frequency control means, an automatic tuning control system comprising, means for dividing the signal output of said oscillator to provide two outputs, a mixer energized by a first output of said dividing means and a radio frequency signal, a discriminator circuit energized by an output of said mixer and providing over a certain range an output voltage that is a function of the frequency deviation of said oscillator from a preselected frequency, means for applying said output voltage of said discriminator to said frequency control electrode for controlling the frequency of said oscillator, and means responsive to the second of said outputs of said signal dividing means for obtaining a control voltage for controlling said mechanical frequency control means, said mechanical frequency control means causing the mechanical tuning of said oscillator to sweep back and forth about the frequency of oscillation established by said discriminator output, whereby the signal output from said oscillator is a maximum.

12. An automatic tuning control system as in claim 11, wherein said means responsive to the second of said outputs of said signal dividing means comprises, a detector energized by the second of said outputs of said dividing means, said detector providing an output voltage proportional to the signal output of said oscillator, trigger circuits energized by said output voltage of said detector and providing a triggering control output each time said signal output of said oscillator decreases from a maximum, and control circuits for said mechanical frequency control means energized by said trigger control output.

13. Apparatus as in claim 11 wherein said local oscillator includes a cavity resonator and wherein said mechanical frequency control means is adapted to tune the cavity resonator of said oscillator.

References Cited in the file of this patent

UNITED STATES PATENTS

| | | |
|---|---|---|
| 2,259,690 | Hansen | Oct. 21, 1941 |
| 2,337,214 | Tunick | Dec. 21, 1943 |
| 2,374,810 | Fremlin | May 1, 1945 |
| 2,380,496 | Beard | July 31, 1945 |
| 2,414,785 | Harrison | Jan. 21, 1947 |
| 2,475,074 | Bradley et al. | July 5, 1949 |
| 2,477,616 | Jaynes | Aug. 2, 1949 |
| 2,509,280 | Sziklai et al. | May 30, 1950 |
| 2,562,943 | Pensyl | Aug. 7, 1951 |

OTHER REFERENCES

"Automatic Control of R. F. Heaters," March 1950, "Electronic Engineering," page 104.